US005243228A

United States Patent [19]

Maruyama et al.

[11] Patent Number: 5,243,228

[45] Date of Patent: Sep. 7, 1993

[54] SUBSTRATE BIAS VOLTAGE GENERATOR CIRCUIT

[75] Inventors: Keiji Maruyama, Kawasaki; Naokazu Miyawaki, Yokohama, both of Japan

[73] Assignee: Kabushiki Kaisha Toshiba, Kawasaki, Japan

[21] Appl. No.: 865,258

[22] Filed: Apr. 8, 1992

[30] Foreign Application Priority Data

Apr. 8, 1991 [JP] Japan .................................. 3-75156

[51] Int. Cl.[5] ...................... H03K 3/01; H03K 17/687

[52] U.S. Cl. ................................ 307/296.2; 307/600; 307/603; 307/578; 307/264

[58] Field of Search ..................... 307/296.2, 600, 603, 307/578, 264

[56] References Cited

U.S. PATENT DOCUMENTS 4,820,936 4/1989 Veendrick et al. .............. 307/296.2
5,122,680 6/1992 Stakely et al. ...................... 307/362

FOREIGN PATENT DOCUMENTS 0193056 11/1984 Japan .............................. 307/296.2
0016556 1/1987 Japan .............................. 307/296.2

OTHER PUBLICATIONS

Frantz et al. IBM Tech. Disc. Bul. "MOSFET Substrate Bias-Voltage Generator" vol. 11, No. 10 Mar. 1969.

IBM Tech. Disc. Bul. "Charging Circuit for a Substrate Generator Pump Capacitor" vol. 27 No. 12 May 1985.

*Primary Examiner*—William L. Sikes
*Assistant Examiner*—M. R. Wambach
*Attorney, Agent, or Firm*—Foley & Lardner

[57] ABSTRACT

A substrate bias voltage generator circuit has a substrate bias voltage detector circuit, a substrate bias driver circuit, and a charge pump circuit. the substrate bias voltage detector circuit detects a substrate bias voltage applied to a semiconductor substrate and outputs a substrate bias voltage detection signal. The substrate bias detector circuit includes a P-channel transistor with a gate terminal and an N-channel transistor with a substrate terminal, both terminals being connected to the semiconductor substrate and the substrate bias voltage which is a back bias for the N-channel transistor. The substrate bias driver circuit is responsive to the substrate bias voltage detection signal outputted from the substrate bias voltage detector circuit, and outputs a drive signal when the absolute value of the substrate bias voltage is equal to or smaller than a predetermined value, and stops outputting the drive signal when the absolute value of the substrate bias voltage is larger than the predetermined value. The charge pump circuit is responsive to the drive signal from the substrate bias driver circuit, and generates the substrate bias voltage.

7 Claims, 7 Drawing Sheets

SUBSTRATE BIAS VOLTAGE GENERATOR CIRCUIT

BACKGROUND OF THE INVENTION

The present invention relates to a substrate bias voltage generator circuit, and more particularly, to a substrate bias voltage generator circuit having a circuit for detecting a substrate bias voltage.

A bias voltage is applied to the substrate of a semiconductor memory device in order to prevent a parasitic p-n junction from being forward biased by undershooting of an externally inputted signal, or to increase the speed of operation by enlarging a depletion layer a p-n junction to reduce parasitic capacitance.

Inexpensive, large capacity semiconductor memory devices have been desired so as to meet the rapid profusion of machines such as personal computers. An example of such inexpensive, large capacity semiconductor memory devices is a dynamic random access memory (DRAM). DRAMs are required to be backed up to maintain their data. For a battery back-up, it is necessary to reduce the current consumption during a standby state. Several circuits in a DRAM will consume current during the standby state. Of these circuits, a substrate bias voltage generator circuit consumes most of the current. It is therefore important to reduce current consumption of the substrate bias voltage generator circuit.

SUMMARY OF THE INVENTION

It is therefore an object of the present invention to provide a substrate bias voltage generator circuit capable of reducing the current consumed.

According to one aspect of the present invention there is included, a substrate bias voltage generator circuit comprising: a substrate bias voltage detector circuit for detecting a substrate bias voltage applied to a semiconductor substrate and outputting a substrate bias voltage detection signal the gate of the first P-channel transistor and the substrate terminals of any N-channel transistors therein are connected to the semiconductor substrate to which an N-channel back bias is supplied; a substrate bias driver circuit responsive to the substrate bias voltage detection signal outputted from the substrate bias voltage detector circuit, for outputting a drive signal when the absolute value of the substrate bias voltage is equal to or smaller than a predetermined value, and stopping output of the drive signal when the absolute value of the substrate bias voltage is larger than the predetermined value; and a charge pump circuit responsive to the drive signal from the substrate bias driver circuit, for generating the substrate bias voltage.

Consumption current of the substrate bias voltage generator circuit during the standby state depends on through current leaking to the semiconductor substrate of the substrate bias voltage detector circuit. According to the present invention, the gate of the first P-channel transistor and the substrate terminals of any N-channel transistors therein are connected to the semiconductor substrate to which an N-channel back bias is supplied. Therefore, through current flows through the ground potential terminal, and hardly at all through the semiconductor substrate via the substrate bias potential terminal, considerably reducing the current consumed.

The substrate bias voltage detector circuit may comprise a load element connected at one end terminal to a power supply voltage terminal, the load element being normally on, and a driver circuit connected at one end terminal to the other end terminal of the load element, and at the other end terminal to a ground potential terminal, the driver circuit having a P-channel transistor whose gate is supplied with the substrate bias voltage. Also in this case, current flows from the load element to the ground potential terminal via the P-channel transistor of the driver circuit, and will not flow into the semiconductor substrate, reducing consumption current.

DESCRIPTION OF THE PREFERRED EMBODIMENTS

Figure 1:
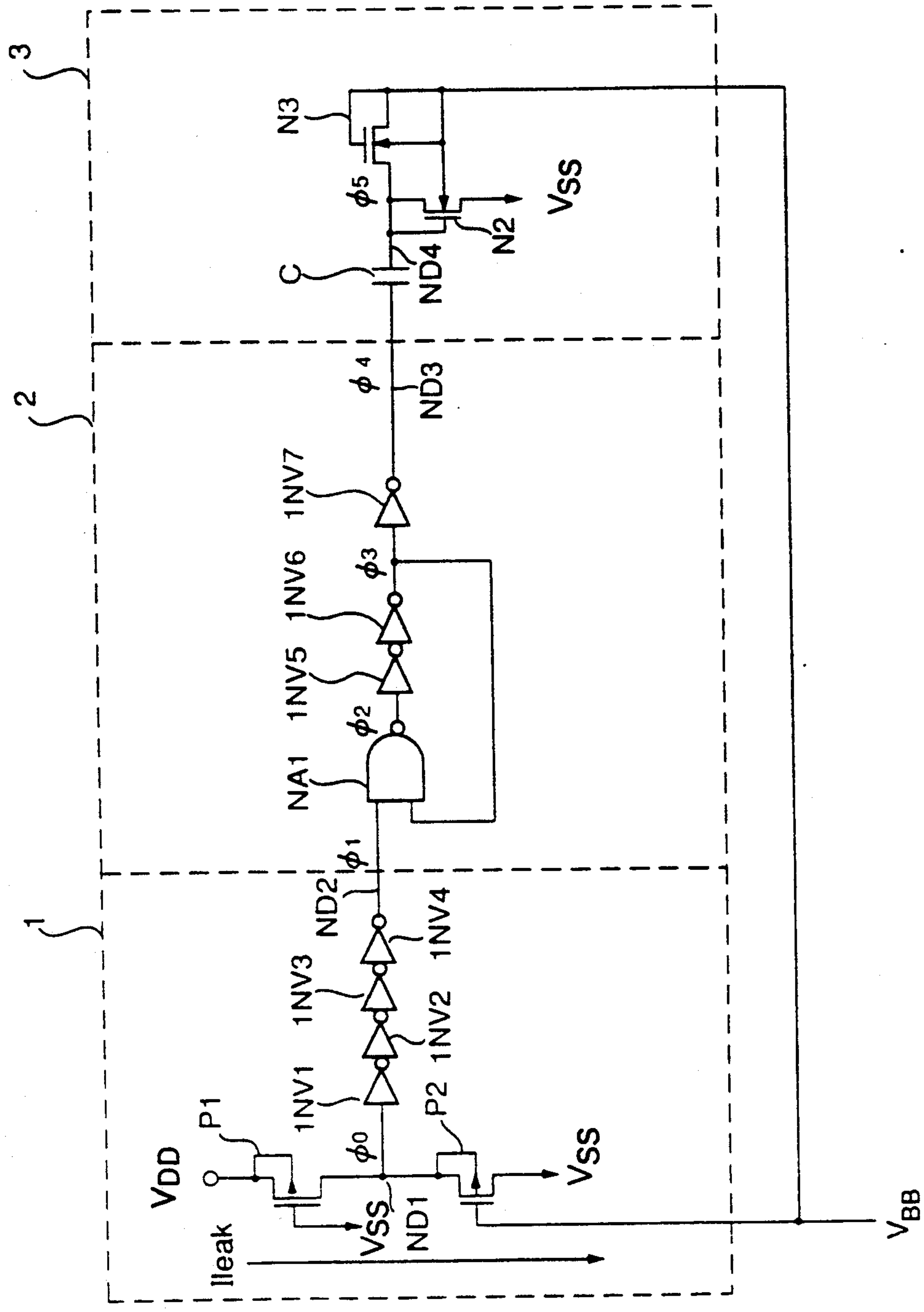
FIG. 1 is a circuit diagram showing the structure of a substrate bias voltage generator circuit according to an embodiment of the present invention.

Preferred embodiments of the present invention will be described with reference to the accompanying drawings. FIG. 1 shows the structure of a substrate bias voltage generator circuit according to an embodiment of the present invention.

The substrate bias voltage generator circuit has a substrate bias voltage detector circuit 1, a substrate bias driver circuit 2, and a charge pump circuit 3. The substrate bias voltage detector circuit 1 is constructed of a P-channel transistor Pl, P2, and inverters INV1 to INV4. The substrate bias driver circuit 2 is constructed of a NAND gate NA1, and inverters INV5 to INV7. The charge pump circuit 3 is constructed of a capacitor C, and N-channel transistors N2 and N3.

In the substrate bias voltage detector circuit 1, the P-channel transistor P1 has a source connected to a power source voltage $V_{DD}$ terminal, a drain connected to a node ND1, and a gate connected to a ground potential $V_{SS}$ terminal. The P-channel transistor P2 connected in series to the P-channel transistor P1 has a source connected to the node ND1, a gate connected to a substrate bias voltage $V_{BB}$ terminal, and a drain connected to the ground voltage $V_{SS}$ terminal. The P-channel transistor P1 and P2 are both normally on.

The characteristic features of the substrate bias voltage detector circuit 1 of this embodiment are as follows. The gate of the P-channel transistor P2 and a substrate terminal of any N-channel transistor such as N2 and N3 to which a back bias voltage for N-channel transistors to be applied, are connected to the semiconductor substrate bias voltage $V_{BB}$. Such N-channel transistors not shown in FIG. 1 include the N-channel transistors of the inverter train INV1 to INV4 conventionally formed by CMOS transistors used, and an N-channel transistor in place of the P-channel transistor P1 as in FIGS. 7 and 8, respectively.

Figure 7:
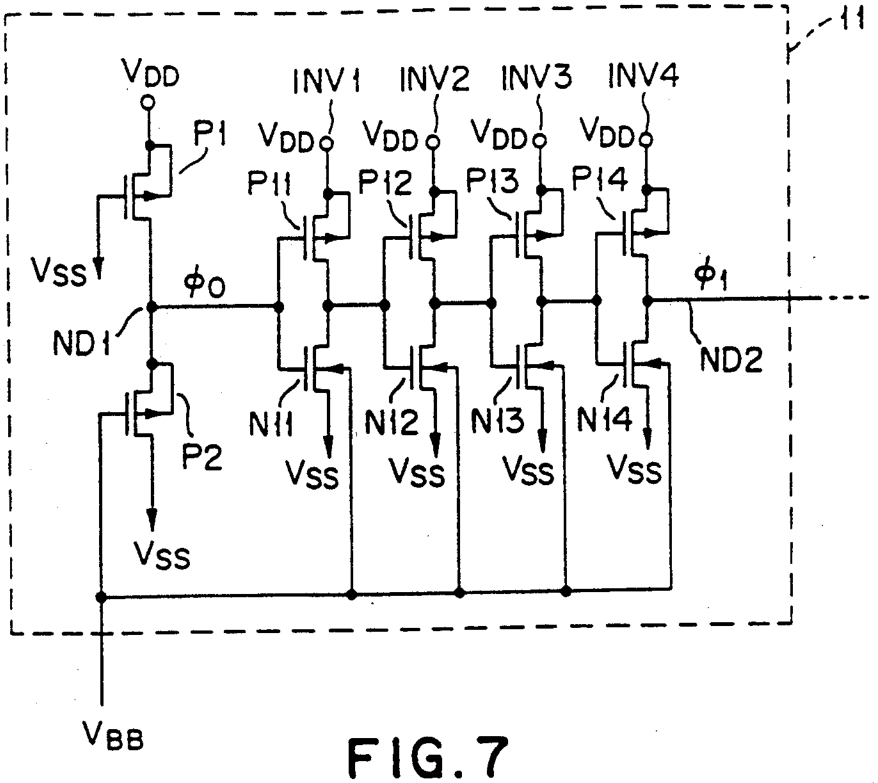
FIG. 7 is a circuit diagram showing the detailed structure of a substrate bias voltage detector circuit 1 shown FIG. 1.

In the substrate bias voltage detector circuit 11 of FIG. 7, the inverters INV1 to INV4 are composed of CMOS transistors approximately conventionally. The inverter INV1 is composed of a P-channel transistor P11 and a N-channel transistor N11, the inverter INV2 is composed of a P-channel transistor P12 and a N-channel transistor N12, the inverter INV3 is composed of a P-channel transistor N12, the inverter INV3 is composed of a P-channel transistor P13 and a N-channel transistor N13, and the inverter INV4 is composed of a P-channel transistor P14 and a N-channel transistor N14, respectively.

Among the terminals of transistors P11–P14 and N11–N14, only the substrate terminals of N-channel transistors N11–N14, which would conventionally be connected to their respective source terminals are instead supplied with a substrate bias voltage $V_{BB}$, by being connected to the semiconductor substrate. Accordingly, in the semiconductor components constituting the substrate bias voltage detector circuit 1, only the gate terminal of the P-channel transistor P2 and the substrate terminals of N-channel transistors N11–N14 are connected to the semiconductor substrate.

Figure 8:
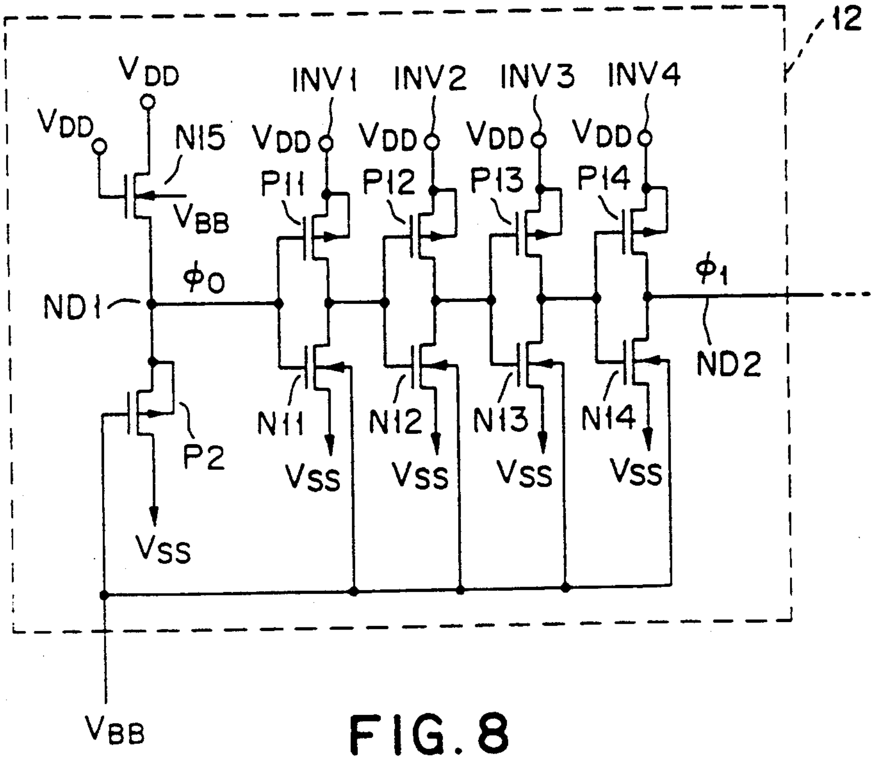
FIG. 8 is a circuit diagram showing another structure of the substrate voltage detector.

The P-channel transistor P1 can be replaced by a N-channel transistor and the circuit configuration in this case is shown in the circuit 12 in FIG. 8. A N-channel transistor N15 is connected between the power supply voltage $V_{DD}$ terminal and the node ND1. The gate terminal of the transistor N15 is connected to the power supply voltage $V_{DD}$ terminal and the substrate terminal of the transistor N15 to be supplied with a substrate bias voltage $V_{BB}$ is connected to the semiconductor substrate.

The N-channel transistor N15 of the circuit 12 is normally on like the P-channel transistor P1 of the circuit 1 shown in FIG. 1. A voltage, in which the potential difference between the voltage $V_{DD}$ and $V_{BB}$ is divided by the conductance ratio of the P-channel transistor P2 to the N-channel transistor N15, is outputted from the node ND1 as a signal $\phi_0$. This operation is the same as that of the circuit 1 shown in FIG. 1. The conductance of N-channel transistor N15 is set to the same value as that of P-channel transistor P1.

In the circuit 12 shown in FIG. 8, in addition to the gate of P2 only the substrate terminal of the N-channel transistor N15 and the substrate terminals of the N-channel transistors N11–N14 of the inverter train INV-1-INV4 are connected to the semiconductor substrate.

Connected to the node ND1 is an input terminal of the inverter train INV1 to INV4 whose output terminal is connected to a node ND2.

The node ND2 is connected to one input terminal of a NAND gate NA1 of the substrate bias drive circuit 2, the output terminal thereof being connected to an input terminal of the inverter train INV5 and INV6. An output terminal of the inverter train INV5 and INV6 is connected to an input terminal of the inverter INV7 and to the other input terminal of the NAND gate NA1. An output terminal of the inverter INV7 is connected to a node ND3.

The node ND3 is connected to one terminal of the capacitor C of the charge pump circuit 3, the other terminal thereof being connected to a node ND4. The node ND4 is connected to the drain and gate of the N-channel transistor N2, the source thereof being connected to the ground potential $V_{SS}$ terminal. The drain and gate of the N-channel transistor N3 are connected to the substrate bias voltage $V_{BB}$ terminal, and the source thereof is connected to the node ND4. The substrate terminals of the N-channel transistors N2 and N3 are both connected to the substrate bias voltage $V_{BB}$ terminal.

In the substrate bias voltage detector circuit 1, the potential difference between the power source voltage $V_{DD}$ and substrate bias voltage $V_{BB}$ is divided by conductance ratio of the P-channel transistor P1 to the P-channel transistor P2, so that a signal $\phi_0$ representing the substrate bias voltage $V_{BB}$ appears at the node ND1. This signal $\phi_0$ is then applied to the inverter train INV1 to INV4. The inverter train INV1 to INV4 delays the signal $\phi_0$ by a delay time td, and outputs a control signal $\phi_1$ for controlling the substrate bias driver circuit 2.

Figure 4:
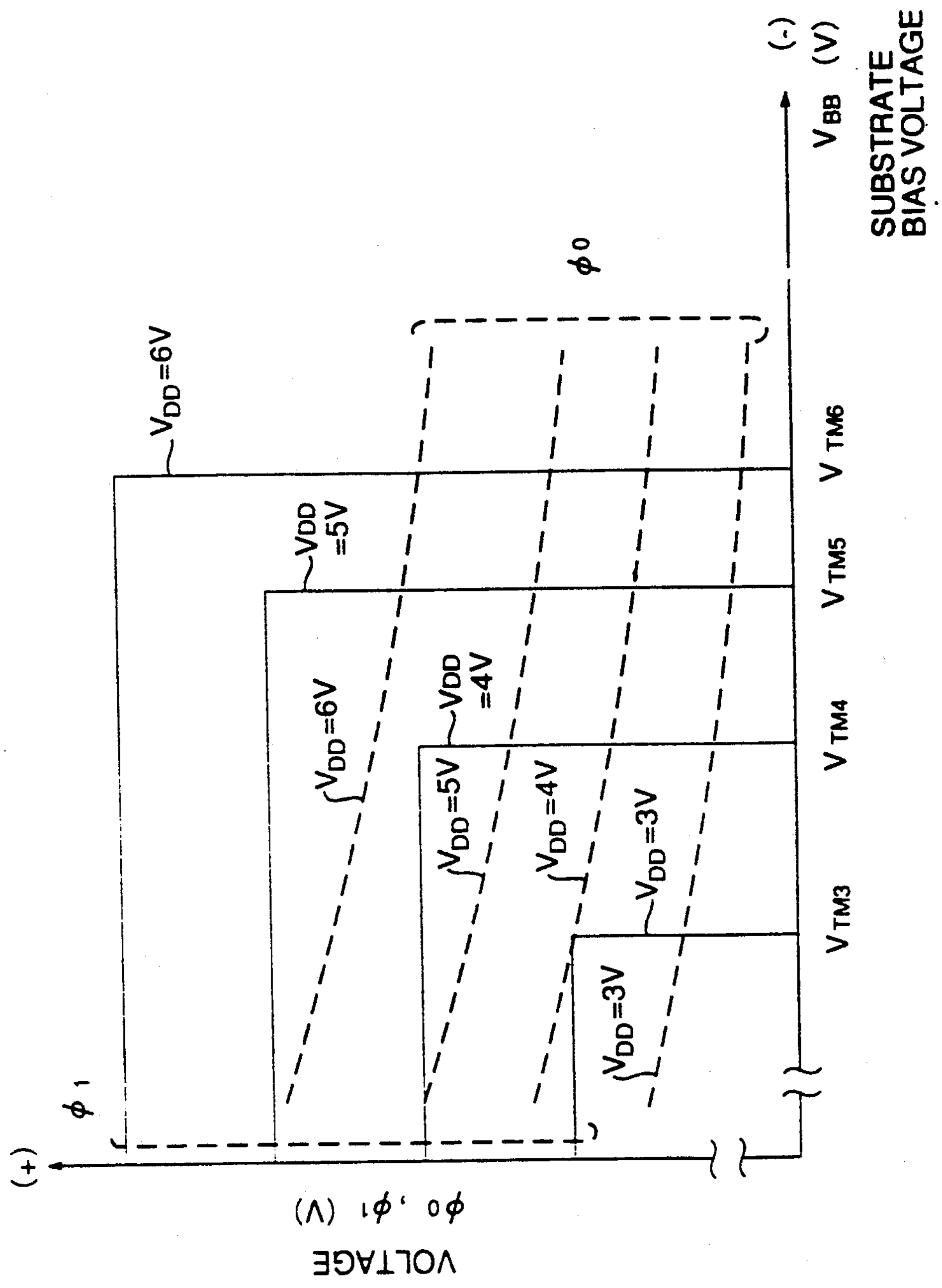
FIG. 4 shows the static characteristics of a substrate bias voltage of the substrate bias voltage detector circuit of the conventional substrate bias voltage generator circuit.

FIG. 4 shows a change in level of the signals $\phi_0$ and $\phi_1$ relative to the substrate bias voltage $V_{BB}$, representing the static characteristics of the substrate bias voltage detector circuit 1. This signal $\phi_0$ indicated by a broken line changes with the power source voltage $V_{DD}$ taking discrete voltages from 3 V to 6 V at 1 V steps. As the substrate bias voltage $V_{BB}$ goes deeper, i.e., goes toward the negative side, the gate voltage of the P-channel transistor P2 increases, and so the conductance increases. Therefore, the voltage of the signal $\phi_0$ gradually decreases. While this voltage is equal to or higher than the operation threshold value Vth of the inverter INV1, a high level signal $\phi_1$ is outputted from the inverter train INV1 to INV4. When the voltage becomes lower than the threshold value Vth, a low level signal $\phi_1$ is outputted. Consider the example when the power source voltage $V_{DD}$ is 3 V as shown in FIG. 4. While the substrate bias voltage $V_{BB}$ is shallower than $V_{TH3}$ corresponding to the operation threshold value of the substrate bias voltage detector circuit 1, the high level signal $\phi_1$ is outputted. When $V_{BB}$ becomes deeper than $V_{TH3}$, the low level signal $\phi_1$ is outputted. If the power source voltage $V_{DD}$ is higher than 3 V, the signal will not take a low level unless the substrate bias voltage $V_{BB}$ goes deeper to the lower operation threshold values $V_{TH4}$ to $V_{TH6}$.

If the signal $\phi_1$ outputted from the substrate bias voltage detector circuit 1 is a high level, the substrate bias drive circuit 2 operates, and if a low level, it stops.

When the high level signal $\phi_1$ is inputted to the substrate bias drive circuit 2, the circuit 2 outputs from the node ND3 a pulse signal $\phi_4$ whose period is defined by the delay time of the NAND gate NA1 and inverter train INV5 to INV7. If the signal $\phi_1$ is a low level, the pulse signal $\phi_4$ is not outputted and the node ND3 is maintained at a low level.

Figure 5:
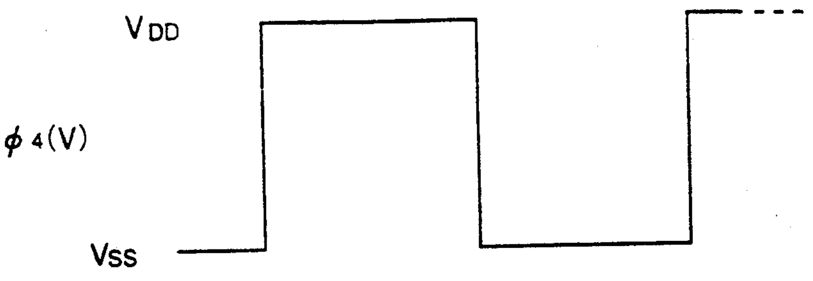
FIGS. 5(*a*), 5(*b*) and 5(*c*) are timing charts showing waveforms at the charge pump circuit of the conventional substrate bias voltage generator circuit.
Figure 5:
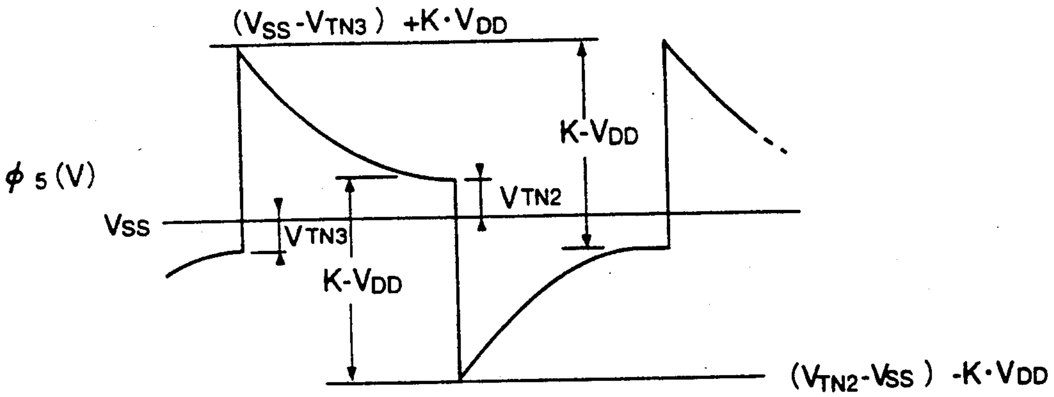
Figure 5:
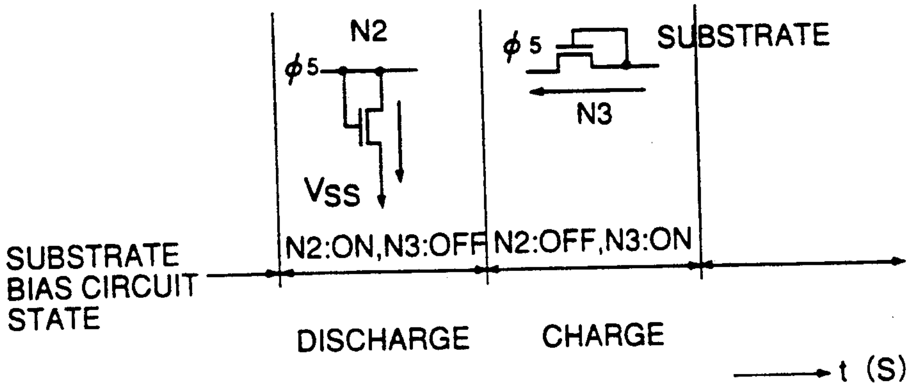

After the pulse signal $\phi_4$ such as shown in FIG. 5(*a*) is inputted to the charge pump circuit 3, the substrate is fixed to the ground potential ($V_{SS}$) and enters a stable condition after a sufficient time period. The operation in this stable condition is as follows. When the signal $\phi_4$ rises from a low level (ground potential $V_{SS}$) to a high level (power source potential $V_{DD}$), the potential of the signal $\phi_5$ outputted via the node ND4 to the capacitor C rises starting from an initial value ($V_{SS}-V_{TN3}$). The potential $V_{TN3}$ corresponds to the threshold value of the N-channel transistor N3. The signal $\phi_5$ rises from ($V_{SS}-V_{TN3}$) by K * $V_{DD}$. K is a coupling ratio of the capacitor C to a parasitic capacitor C1 at the node ND4, and is represented by K=C/(C+C1).

In order to improve the capacity of the charge pump circuit 3 for pumping up electric charges from the substrate, it is necessary to make K as near to "1" as possible. In view of this, the capacitance of the capacitor C is set sufficiently large relative to the capacitor C1.

When the signal $\phi_5$ rises to ($V_{SS}-V_{TN3}$)=K * $V_{DD}$, the gate potential of the N-channel transistor N2 rises to turn on the transistor N2. Then, electric charges accumulated in the capacitor C are discharged, so that the potential of the signal $\phi_5$ decreases to ($V_{TN2}-V_{SS}$) corresponding to the threshold value of the N-channel transistor N2. When the signal $\phi_4$ decreases to a low level, the potential of the signal $\phi_5$ decreases starting from ($V_{TN2}-V_{SS}$) by K * $V_{DD}$. While the N-channel transistor N3 turns on and the potential of the signal $\phi_5$ decreases to ($V_{SS}-V_3$) corresponding to the threshold value of the transistor N3, electric charges from the substrate are accumulated in the capacitor C. As described above, while the N-channel transistor N2 turns on and the N-channel transistor N3 turns off, electric charges accumulated in the capacitor C are discharged to the ground potential terminal (refer to FIG. 5(*c*)), and while the N-channel transistor N2 turns off and the N-channel transistor N3 turns on, electric charges from the substrate are accumulated in the capacitor C. These operations are repeated to gradually lower the substrate bias voltage $V_{BB}$.

The substrate bias voltage $V_{BB}$ finally obtained is expressed by the following equation (1):

$$V_{BB}=-K * V_{DD}+(V_{TN2}+V_{TN3}) \quad (1)$$

Figure 6:
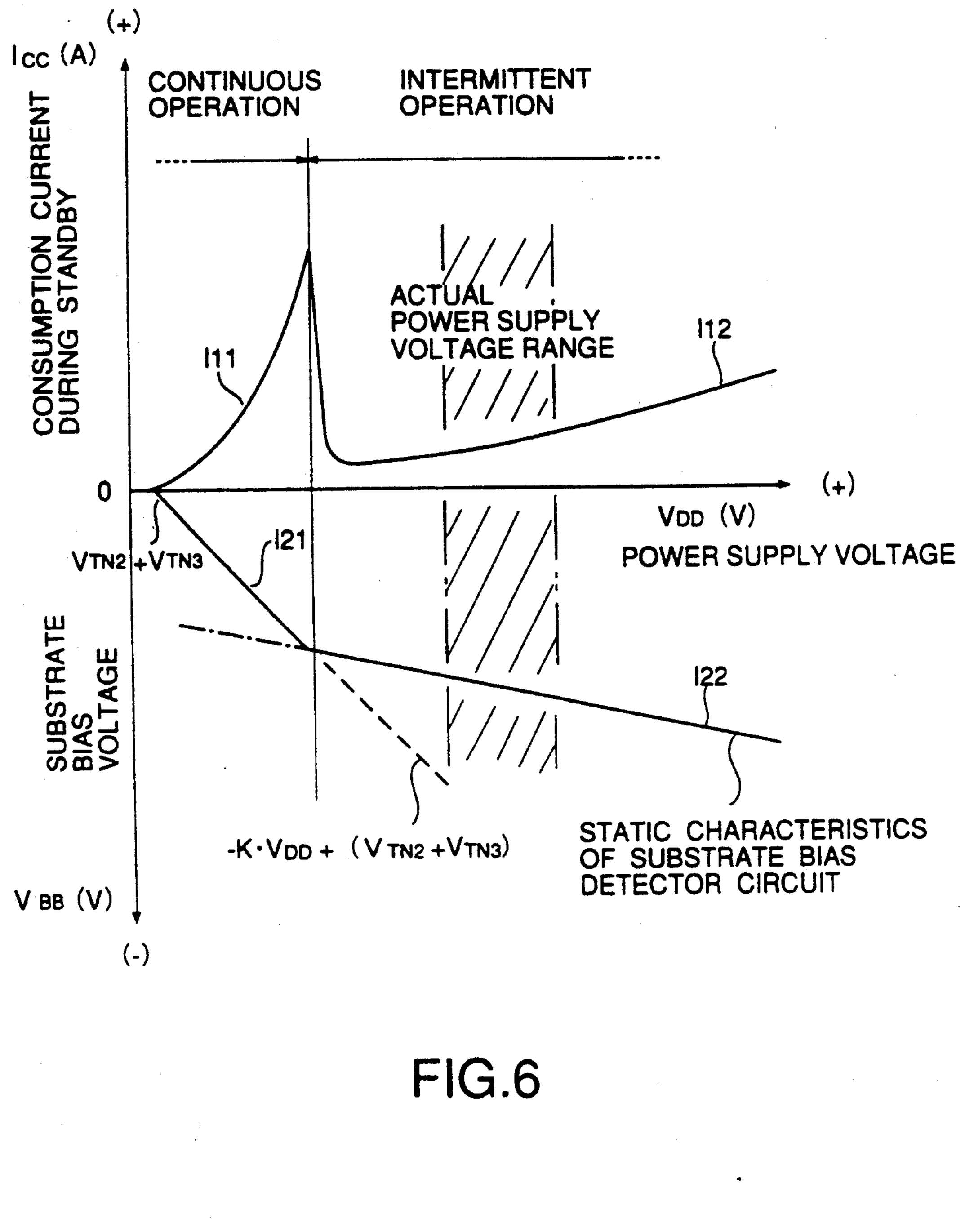
FIG. 6 shows the dynamic characteristics of a consumption current and substrate bias voltage relative to a power source voltage of the conventional substrate bias voltage generator circuit.

The static characteristics of the substrate bias voltage generator circuit performing the above operations are shown in FIG. 6. After the pulse signal $\phi_4$ is outputted from the substrate bias driver circuit 2, the charge pump circuit 3 enters a continuous operation state. When the power source voltage $V_{DD}$ becomes $V_{TN2}+V_{TN3}$ after power-on, the substrate bias voltage $V_{BB}$ decreases, starting from this potential at a slope of −K * $V_{DD}$ along line $1_{21}$. In this continuous operation state, the current consumption during the standby operation rapidly increases as shown by $1_{11}$ as the power source voltage $V_{DD}$ increases.

When the substrate bias voltage $V_{BB}$ decreases to the operation threshold value $V_{TM3}$ of the substrate bias voltage detector circuit 1, the signal $\phi_1$ has a low level so that the substrate bias driver circuit 2 does not output the pulse signal $\phi_4$. In this condition, the charge pump circuit 3 enters an intermittent operation state intermittently repeating the operation state and stop state.

This intermittent operation state will be described with reference to FIG. 2. As the substrate bias voltage $V_{BB}$ decreases from time t1, the output signal $\phi_0$ of the substrate bias voltage detector circuit 1 gradually decreases. When the potential of the signal becomes lower than the operation threshold value $V_{TH}$ of the inverter INV1, the signal $\phi_1$ has a low level at time t2 after the lapse of the delay time td provided by the inverter train INV1 to INV4. Then, the substrate bias drive circuit 2 does not output the pulse signal $\phi_4$ to stop the operation of the charge pump circuit 3.

When the operation of the charge pump circuit 3 stops at time t2, electric charges accumulate in the substrate by current flowing into the substrate from transistors, etc., so the substrate bias voltage $V_{BB}$ rises.

As the substrate bias voltage $V_{BB}$ rises and the signal $\phi_0$ at the substrate bias voltage detector circuit 1 exceeds the threshold value $V_{TH}$ of the inverter INV1, the signal $\phi_1$ has a high level at time t3 after the delay time td. The pulse signal $\phi_4$ is again outputted from the substrate bias driver circuit 2 and the charge pump circuit 3 enters an operation state to lower the substrate bias voltage $V_{BB}$.

As described above, with the operation threshold value of the substrate bias voltage detector circuit being set within an actual use range of the power source voltage, the substrate bias voltage detector circuit 1 detects the substrate bias voltage $V_{BB}$ and the substrate bias driver circuit 2 and charge pump circuit 3 intermittently repeat the operation state and stop state. As a result, the consumption current is spread over a greater time and the average consumption current $I_{CC}$ can be reduced as shown by the line $1_{12}$ of FIG. 6.

As described above, the inverter train INV1 to INV4 of the substrate bias voltage detector circuit 1 has inputted thereto the signal $\phi_0$ from the node ND1, delays the signal $\phi_0$ by a delay time td, and outputs the signal $\phi_1$ from the node ND2. Due to the delay function of the inverter train INV1 to INV4, the substrate bias voltage generator circuit can operate stably.

Figure 2:
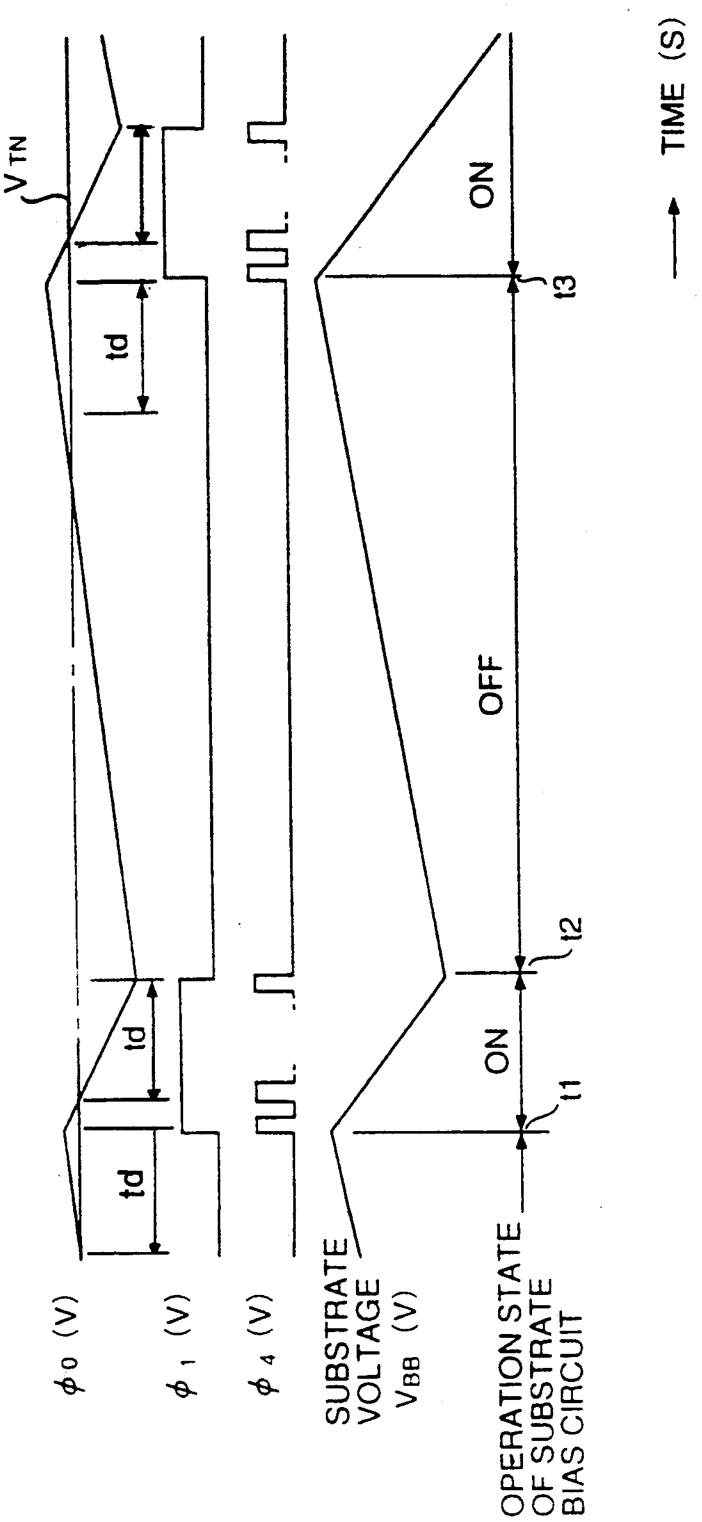
FIG. 2 is a timing chart showing waveforms during the intermittent operation state of the substrate bias voltage generator circuit.

With reference to FIG. 2, the substrate bias voltage $V_{BB}$ rises up to time t1 due to current flowing in the semiconductor substrate. When the level of the signal $\phi_0$ at the node ND1 reaches the threshold $V_{TN}$ of the inverter train INV1 to INV4, a high level signal $\phi_1$ is outputted from inverter train INV1 to INV4 after the lapse of the delay time td.

The signal $\phi_1$ is inputted into the substrate bias driver circuit 2 and the pulse signal $\phi_4$ is outputted into the charge pump circuit 3. When the charge pump circuit 3 starts operation, the substrate bias voltage $V_{BB}$ starts to decrease. While the substrate bias voltage $V_{BB}$ is decreasing, the signal $\phi_0$ is also decreasing. When the signal $\phi_0$ becomes lower than the threshold $V_{TN}$ of the inverter train INV1 to INV4, the signal $\phi_1$ takes a low level after the elapse of the delay time td. Then, the pulse signal $\phi_4$ is not outputted, and the operation of the charge pump circuit 3 stops.

In this way, the time period during which the signal $\phi_1$ is in the high level and the time period during which the pulses of signal $\phi_4$ are outputted can be set to a desired length by means of the delay time td caused by the inverter train INV1 to INV4.

As described previously, current consumed during the standby state depends on the through current to the substrate. In this embodiment, this through current flows from a power supply voltage terminal $V_{DD}$ to the ground potential $V_{SS}$ terminal via the P-channel transistors P1 and P2, and will not flow into the semiconductor substrate via the substrate bias voltage $V_{BB}$ terminal.

As a result, the stop period from time t2 to time t3 increases during the intermittent operation state of the charge pump circuit 3 as shown in FIG. 2. Current consumption of the substrate bias voltage generator circuit therefore is spread over a greater time to reduce the average consumption current.

Figure 3:
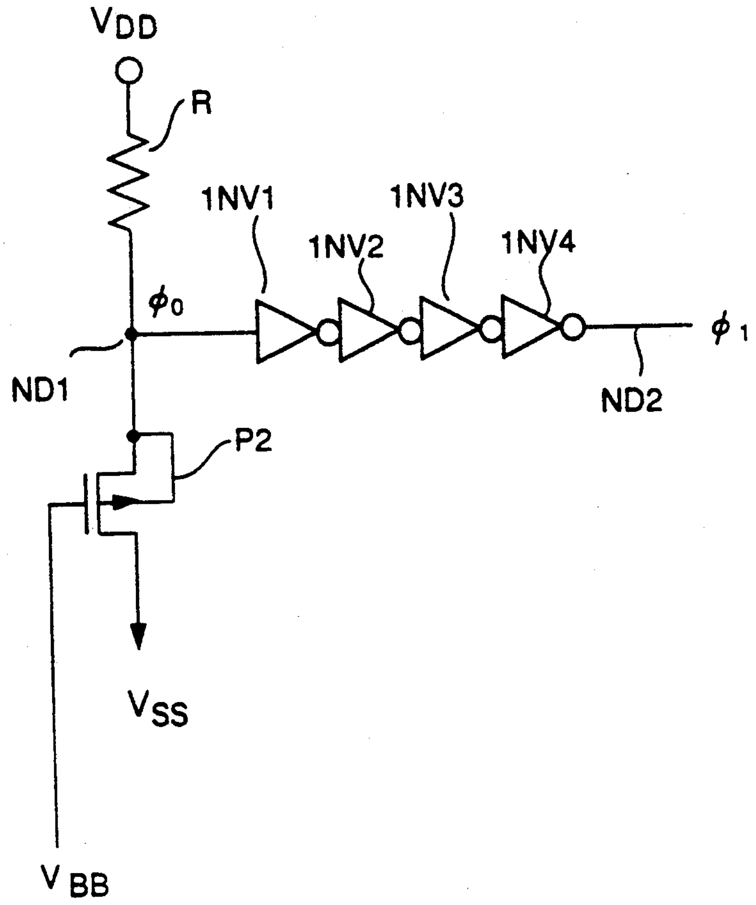
FIG. 3 is a circuit diagram showing the structure of a substrate bias voltage detector circuit of the substrate bias voltage generator circuit according to another embodiment of the present invention.

The above embodiment has been described by way of example only. The invention is not limited thereto, but various modifications are possible. For example, the substrate bias voltage detector circuit may be replaced with the circuit having a structure shown in FIG. 3. A different aspect from the substrate bias voltage detector circuit 1 shown in FIG. 1 resides in the fact that the P-channel transistor P1 is replaced with a resistor R. This resistor R is connected between the power supply voltage $V_{DD}$ terminal and the node ND1, and provides the same function as the P-channel transistor P1. The circuit element between the power supply voltage $V_{DD}$ terminal and the node ND1 may be any type of load. It is necessary for the value of the resistor R and the size of the P-channel transistor P2 to be adjusted to a value suitable for a desired conductance ratio. The smaller the conductance of the load, the more the through current flowing from the power supply voltage $V_{DD}$ terminal to the ground potential $V_{SS}$ terminal can be suppressed, to reduce current consumption during the standby state.

The circuit portion acting as a driver circuit for the substrate bias voltage detector circuit is the P-channel transistor P2 in both the embodiments. Other circuit elements may be added to the P-channel transistor P2. For example, an N-channel transistor may be connected between the drain of the P-channel transistor P2 and the ground potential $V_{SS}$ terminal. In this case, the drain of the N-channel transistor is connected to the drain of the P-channel transistor P2, the source thereof is connected to the ground potential $V_{SS}$ terminal, and the gate is connected to the power supply voltage $V_{DD}$ terminal. The N-channel transistor is therefore normally on.

What is claimed is:

1. A substrate bias voltage generator circuit comprising:

a substrate bias voltage detector circuit for detecting a substrate bias voltage applied to a semiconductor substrate and for outputting a substrate bias voltage detection signal, said substrate bias voltage detector circuit comprising a P-channel transistor having a gate terminal connected to said semiconductor substrate and an N-channel transistor having a substrate terminal connected to said semiconductor substrate, said substrate bias voltage applying a back bias voltage to said N-channel transistor;

a substrate bias driver circuit, responsive to said substrate bias voltage detection signal outputted from said substrate bias voltage detector circuit, for outputting a drive signal when an absolute value of said substrate bias voltage is equal to or smaller than a predetermined value, and for not outputting said drive signal when an absolute value of said substrate bias voltage is larger than said predetermined value; and a charge pump circuit, responsive to said drive signal from said substrate bias driver circuit, for generating said substrate bias voltage.

2. A substrate bias voltage generator circuit according to claim 1, wherein said substrate bias voltage detector circuit further comprises:

a load element having a first end terminal and a second end terminal and being connected at said first end terminal to a power supply voltage terminal, said load element being normally on; and a driver circuit connected at one end terminal to said second end terminal of said load element, and connected at another end terminal to a ground potential terminal, said driver circuit including said P-channel transistor, wherein said substrate bias voltage detection signal is generated at a node interconnecting said second end terminal of said load element and said another end terminal of said driver circuit.

3. A substrate bias voltage generator circuit according to claim 2, wherein said load element is a P-channel transistor having a source terminal connected to said power supply voltage terminal, a drain terminal connected to an end terminal of said P-channel transistor of said driver circuit, and a gate terminal connected to said ground potential terminal.

4. A substrate bias voltage generator circuit according to claim 2, wherein said load element is a resistor connected between said power supply voltage terminal and an end terminal of said P-channel transistor of said driver circuit.

5. A substrate bias voltage generator circuit according to claim 2 wherein said N-channel transistor is said load element.

6. A substrate bias voltage generator circuit according to claim 2 wherein said N-channel transistor is located in an inverter train driven by said P-channel transistor.

7. A substrate bias voltage generator circuit according to claim 2 wherein:

said N-channel transistor is said load element; and said detector circuit further comprising a train of inverters each including an N-channel transistor having a substrate terminal connected to said substrate and to said substrate bias voltage.

* * * * *